United States Patent
Kai et al.

[11] Patent Number: 5,970,014
[45] Date of Patent: Oct. 19, 1999

[54] SEMICONDUCTOR MEMORY DEVICE HAVING TWO OR MORE MEMORY BLOCKS

[75] Inventors: Yasukazu Kai; Tetsuya Mitoma, both of Miyazaki, Japan

[73] Assignee: Oki Electric Industry Co., Ltd., Tokyo, Japan

[21] Appl. No.: 09/084,936

[22] Filed: May 28, 1998

[30] Foreign Application Priority Data

May 30, 1997 [JP] Japan .................................. 9-140766

[51] Int. Cl.⁶ .................................................. G11C 11/00
[52] U.S. Cl. ........................................ 365/230.03; 365/194
[58] Field of Search ........................... 365/230.03, 194, 365/189.08, 221

[56] References Cited

U.S. PATENT DOCUMENTS

| | | | |
|---|---|---|---|
| 5,388,072 | 2/1995 | Matick et al. ...................... | 365/230.03 |
| 5,398,209 | 3/1995 | Iwakiri et al. ...................... | 365/230.03 |
| 5,642,319 | 6/1997 | Nagashima ......................... | 365/194 |
| 5,777,938 | 7/1998 | Nakamura et al. ................. | 365/230.03 |

FOREIGN PATENT DOCUMENTS

| | | |
|---|---|---|
| 5-198171 | 8/1993 | Japan . |
| 6-20484 | 1/1994 | Japan . |

*Primary Examiner*—Son T. Dinh
*Attorney, Agent, or Firm*—Rabin & Champagne, P.C.

[57] ABSTRACT

A semiconductor memory device having two or more memory blocks is disclosed. The disclosed semiconductor memory device comprises first and second memory cores, first and second output circuits and internal output lines connected to the first and second output circuits, respectively. The first and second output circuits are respectively connected to said first and second memory cores for outputting the data in response to first and second control signals, respectively. The disclosed semiconductor memory device further comprises first and second control signal generating circuits. The first and second control signal generating circuits are connected to the first and second output circuits for generating the first and second control signals to the first and second output circuits. The first and second control signal generating circuits receive first and second read signals having the active state and the inactive state that is switched in response to a read control signal. The first and second control signal generating circuits switch the first and second control signals to the active state with a predetermined time delay when the first and second read signals are switched from the inactive state to the active state, while these immediately switch the first and second control signals to the inactive state when the first and second read signal are switched from the active state to the inactive state.

18 Claims, 3 Drawing Sheets

5,970,014

SEMICONDUCTOR MEMORY DEVICE HAVING TWO OR MORE MEMORY BLOCKS

BACKGROUND OF THE INVENTION

The present invention relates to a reading technique in a semiconductor memory device having a plurality of memory blocks.

In a memory device having two or more memory blocks, the access speed can be increased by sequentially reading out data from the memory blocks to a single output node. In order to read out data in sequence from the memory blocks, the output of the memory blocks is switched. The switching is controlled by a read signal.

Where the output is switched, there is a possibility of outputting data from the memory blocks at the same time caused by the difference in a transmission time delay of the read out signals. If this happens, a pass current flows through the memory blocks. The pass current causing such a malfunction that destroys the contents stored in the memory blocks. Efforts made to restrain the influences exerted by the pass current have been imposing a restriction in achieving higher access speed.

SUMMARY OF THE INVENTION

Accordingly, it is an object of the present invention to prevent the pass current through memory blocks. Another object of the present invention is to provide a semiconductor memory device which permits higher access speed.

A semiconductor memory device according to the present invention comprises first and second memory cores, first and second output circuits and internal output lines connected to the first and second output circuits, respectively. The first and second output circuits are respectively connected to said first and second memory cores for outputting the data in response to first and second control signals, respectively. The disclosed semiconductor memory device further comprises first and second control signal generating circuits. The first and second control signal generating circuits are connected to the first and second output circuits for generating the first and second control signals to the first and second output circuits. The first and second control signal generating circuits receive first and second read signals having the active state and the inactive state that is switched in response to a read control signal. The first and second control signal generating circuits switch the first and second control signals to the active state with a predetermined time delay when the first and second read signals are switched from the inactive state to the active state, while these immediately switch the first and second control signals to the inactive state when the first and second read signal are switched from the active state to the inactive state.

DETAILED DESCRIPTION OF THE PREFERRED EMBODIMENTS

Figure 1:
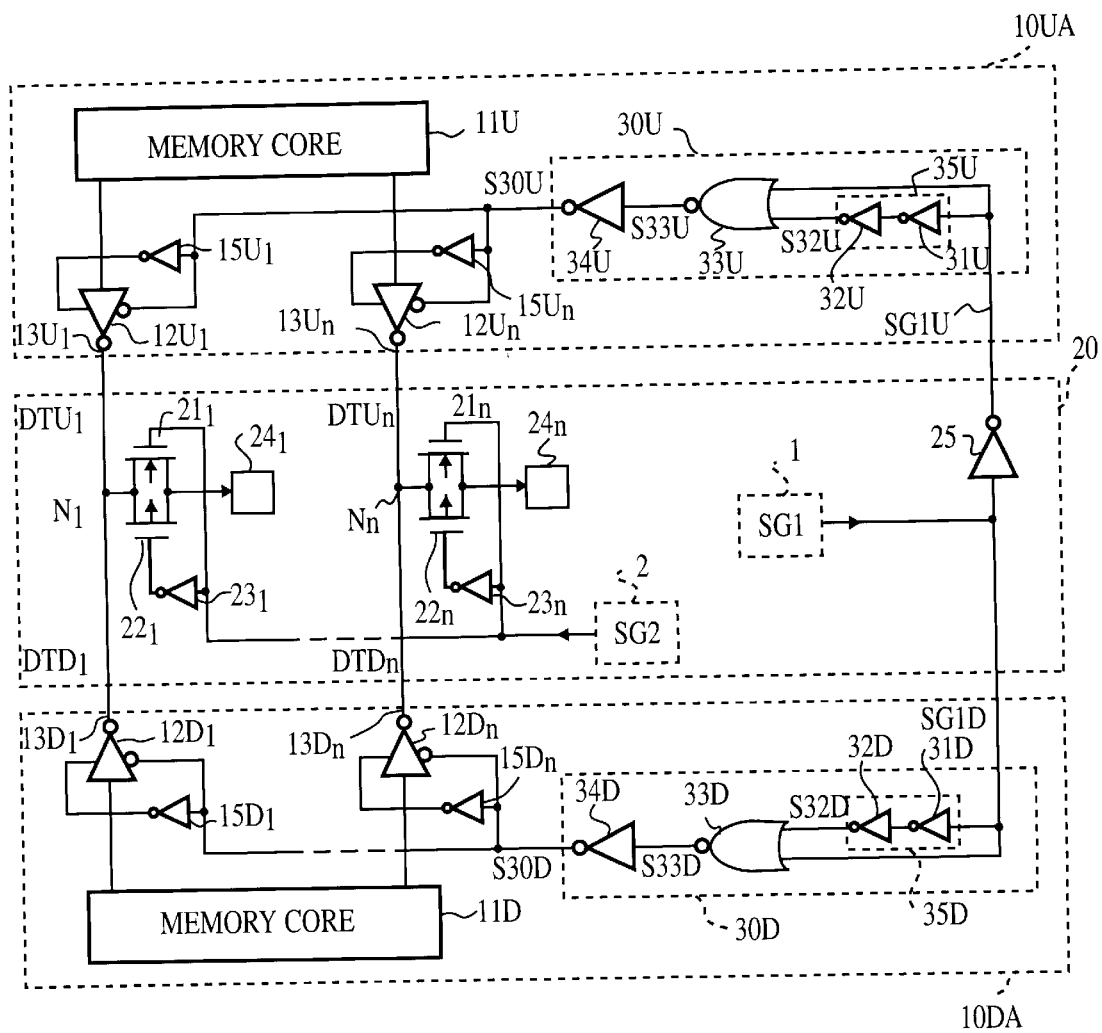
FIG. 1 is a circuit diagram showing a first embodiment of the present invention.

FIG. 1 is a circuit diagram showing a first embodiment of the present invention.

The semiconductor memory device of the first embodiment has a first memory block 10UA and a second memory block 10DA serving as a first memory means and a second memory means, respectively, which share the same constitution. The semiconductor memory device further has a read control unit 20 serving as a read control means for reading out the stored contents from the memory blocks 10UA and 10DA alternately.

The first memory block 10UA has a memory core 11U for storing data. The memory core 11U has a plurality of memory cells. The data stored in the memory core 11U is output to internal output lines 13U1, . . . , 13Un via tristate buffers 12U1, . . . , 12Un which form a first output circuit. The tristate buffer 12Ui (where i=1 through n) is turned ON/OFF in response to a control signal S30U generated from an output control circuit 30U serving as a first output control means. In the tristate buffer 12Ui, the inversion control terminal receives the control signal S30U from the output control circuit 30U and the non-inversion control terminal receives the control signal S30U via an inverter 15Ui (where i=1 through n). The input of the tnistate. buffer 12Ui is connected to the memory core 11U and the output thereof is connected to the read control unit 20 via an internal output line 13Ui (where i=1 through n).

The output control circuit 30U has a first delay circuit 35U constituted by two inverters 31U and 32U to which a first read signal SG1U is applied and which are connected in series. The output of the first delay circuit 35U is connected to a first input of a NOT circuit 33U of a logical OR (hereinafter referred to as "NOR circuit") which is a first logic circuit. The first read signal SG1U is applied to a second input of a NOR circuit 33U. The input of an inverter 34U is connected to the output of the NOR circuit 33U. Issued from the output of the inverter 34U is the control signal S30U.

As in the case of the first memory block 10UA, the second memory block 10DA has a memory core 11D for storing data. The memory core 11D has a plurality of memory cells. The data stored in the memory core 11D is output to internal output lines 13D1, . . . , 13Dn via tristate buffers 12D1, . . . , 12Dn which form a second output circuit. The tristate buffer 12Di (where i=1 through n) is turned ON/OFF in response to a control signal S30D generated from a second output control unit 30D. In the tristate buffer 12Di, the inversion control terminal receives the control signal S30D from the output control unit 30D and the non-inversion control terminal receives the control signal S30D via an inverter 15Di (where i=1 Athrough n). The input of the tristate buffer 12Di is connected to the memory core 11U and the output thereof is connected to the read control unit 20 via an internal output line 13Di (where i=1 through n).

The output control unit 30D has a second delay circuit 35D constituted by two inverters 31D and 32D to which a second read signal SG1D is applied and which are connected in series. The output of the inverter 32D is connected to a first input of a NOR circuit 33D which is a second logic circuit. The second read signal SG1D is applied to a second input of the NOR circuit 33D. The input of an inverter 34D is connected to the output of the NOR circuit 33D. The control signal S33D is generated from the output of the inverter 34D.

The internal output line 13Ui of the first memory block 10UA and the internal output line 13Di of the second memory block 10DA are connected to a node Ni (where i=1 through n) of the read control unit 20. Connected to the node Ni are one terminal of an NMOS 21i and one terminal of a PMOS 22i which are connected in parallel. A read signal SG2 issued from a read signal generating circuit 2 is applied to the gate of the NMOS 21i, while an inverted signal of the read signal SG2 is applied to the gate of the PMOS 21i via an inverter 23i. That is, the NMOS 21i and the PMOS 21i are worked as an output circuit. The other terminal of the NMOS 21i and the other terminal of the PMOS 21i are connected to an output logic circuit 24i. Hence, the data output from the first and second memory blocks 10UA and 10DA to the node Ni is read in response to the read signal SG2.

Further, the read control unit 20 generates the first read signal SG1D to the first memory block 10DA in accordance with the read control signal SG1 generated from a read control signal generating circuit 1. The read control unit 20 also generates the second read signal SG1U for the second memory block 10UA via the inverter 25.

Figure 2:
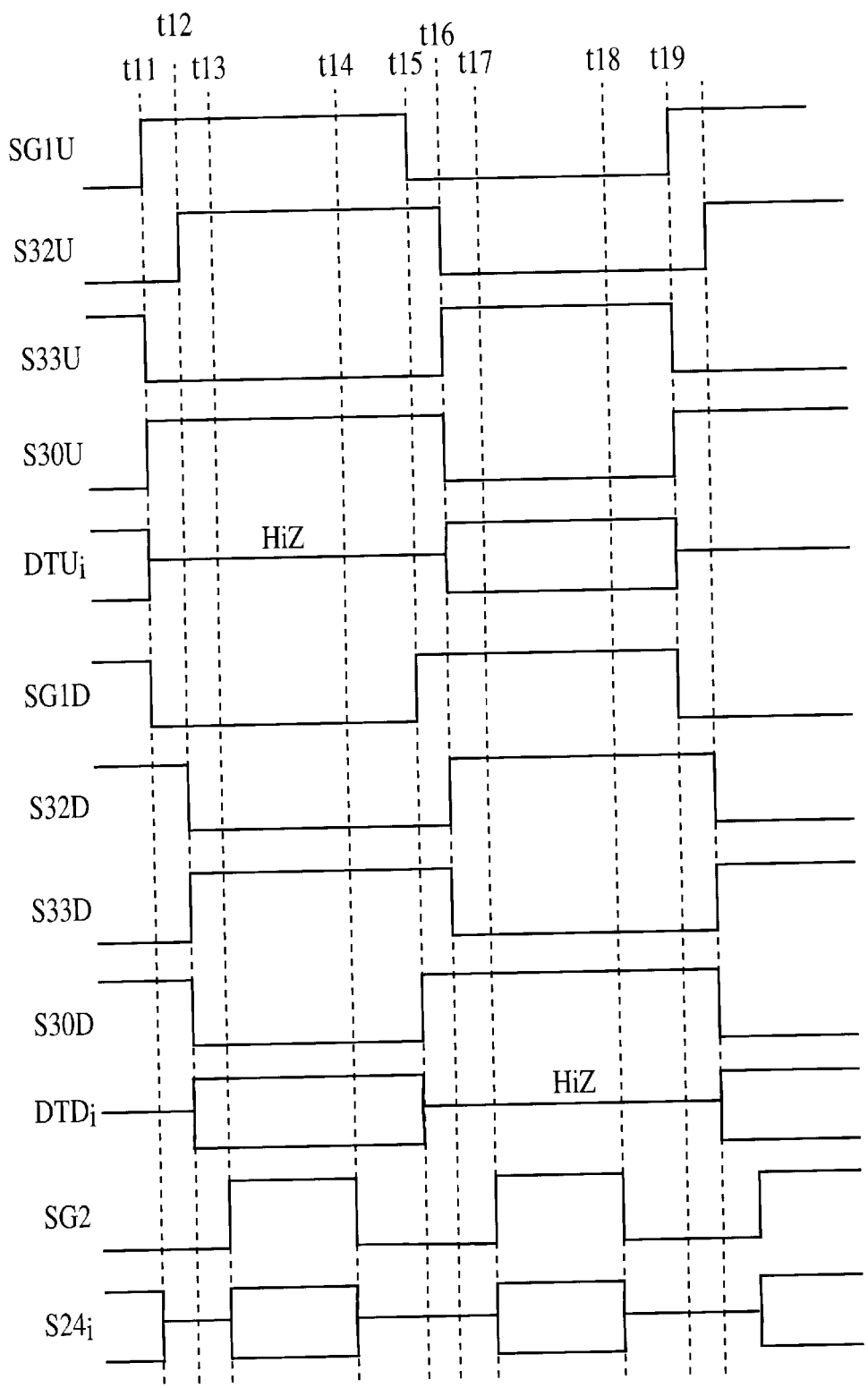
FIG. 2. is timing chart illustrative of the operation timing of the embodiment shown in FIG. 1; nd

FIG. 2 shows a timing chart illustrating the operation timing of the semiconductor memory device of FIG. 1. The operation of the semiconductor memory device of FIG. 1 will now be described with reference to FIG. 2.

The first and second read signals SG1U and SG1D, respectively, which are generated in accordance with the read control signal SG1 are supplied from the read control unit 20 to the first and second memory blocks 10UA and 10DA, respectively.

When the first read signal SG1U is switched from an active state (level L in this embodiment) to an inactive state (level H in this embodiment) at time t11, a signal S33U of the output of the NOR circuit 33U of the output control circuit 30U is switched to level L. The signal S33U is inverted through the inverter 34U and the control signal S30U is switched to level H. This causes the tristate buffer 12Ui to turn OFF, and data DTUi output from the memory core 11U to the internal output line 13i is stopped, placing the internal output line 13Ui in a high impedance state.

On the other hand, the second read signal SG1D which has been switched from level H to level L at time t11 is delayed by the second delay circuit 35D. An output signal S32D of the second delay circuit 35D is switched from level H to level L at time t12 which is delayed from time t11 by a predetermined time.

At time t12, the output signal S32D of the second delay circuit 35D and the second read signal SG1D are both switched to level L, and an output signal S33D of the NOR circuit 33D is switched from level L to level H. The output signal S33D of the NOR circuit 33D is inverted by the inverter 34D, and the control signal S30D is switched to level L. The tristate buffer 12Di turns ON in response to the control signal S30D at level L, and data DTDi is output from the memory core 11D to the internal output line 13Di.

During the period of time from time t13 to time t14 in which the read signal SG2 stays at level H, the data DTDi from the memory core 11D which has been output to the node Ni is read and supplied to the output logic circuit 24i.

At time t15, when the read control signal SG1, which has the same waveform as the second read signal SG1D although it is not shown in FIG. 2, is inverted, the second read signal SG1D is switched from level L to level H. This causes the output signal S33D of the NOR circuit 33D of the output control unit 30D to be switched to level L. The output signal S33D of the NOR circuit 33D of the output control unit 30D is inverted by the inverter 34D, so that the control signal S30D is switched to level H. The tristate buffer 12Di turns OFF in response the control signal S30D at level H, and the output of the data DTDi from the memory core 11D to the internal output line 13Di is stopped, placing the internal output line 13Di in the high impedance state.

The first read signal SG1U which has been switched from level H to level L at time t15 is delayed by the first delay circuit 35U of the output control circuit 30U. For this reason, the output signal S32U of the first delay circuit 35U is not immediately switched to L at time t15. Hence, the control signal S30U is maintained at level H and the tristate buffer 12Ui is accordingly maintained in the OFF state. The output of the data DTUi from the memory core 11U to the internal output line 13Ui remains suspended.

After that, the output signal S32U of the first delay circuit 35U is switched from level H to level L at time t16 which is delayed from time t15 by a predetermined time. When the first read signal SG1U is switched to level L, the output signal S33U of the NOR circuit 33U is switched from level L to level H. The output signal S33U of the NOR circuit 33U is inverted by the inverter 34U into the control signal S30U at level L. This places the tristate buffer 12Ui in the ON state and the data DTUi is output from the memory core 11U to the internal output line 13Ui.

During the period of time from time t17 to time t18 in which the read signal SG2 stays at level H, the data DTUi from the memory core 11U output to the node Ni is read and supplied to the output logic circuit 24i.

The semiconductor memory device of the first embodiment described above has the output control circuits 30U and 30D which generate control signals S30U and S30D, respectively, which are delayed by a predetermined time when the first and second read signals SG1U and SG1D are switched from the inactive state to the active state and which are immediately changed when the signals are switched from the active state to the inactive state. Thus, the output of data from both memory blocks 10UA and 10DA is suspended during, for example, the period of time from time t11 to t12 in FIG. 2, making it possible to prevent the pass current. Moreover, selection of proper delay time permits shorter access time and further reliable access to the memory blocks.

Figure 3:
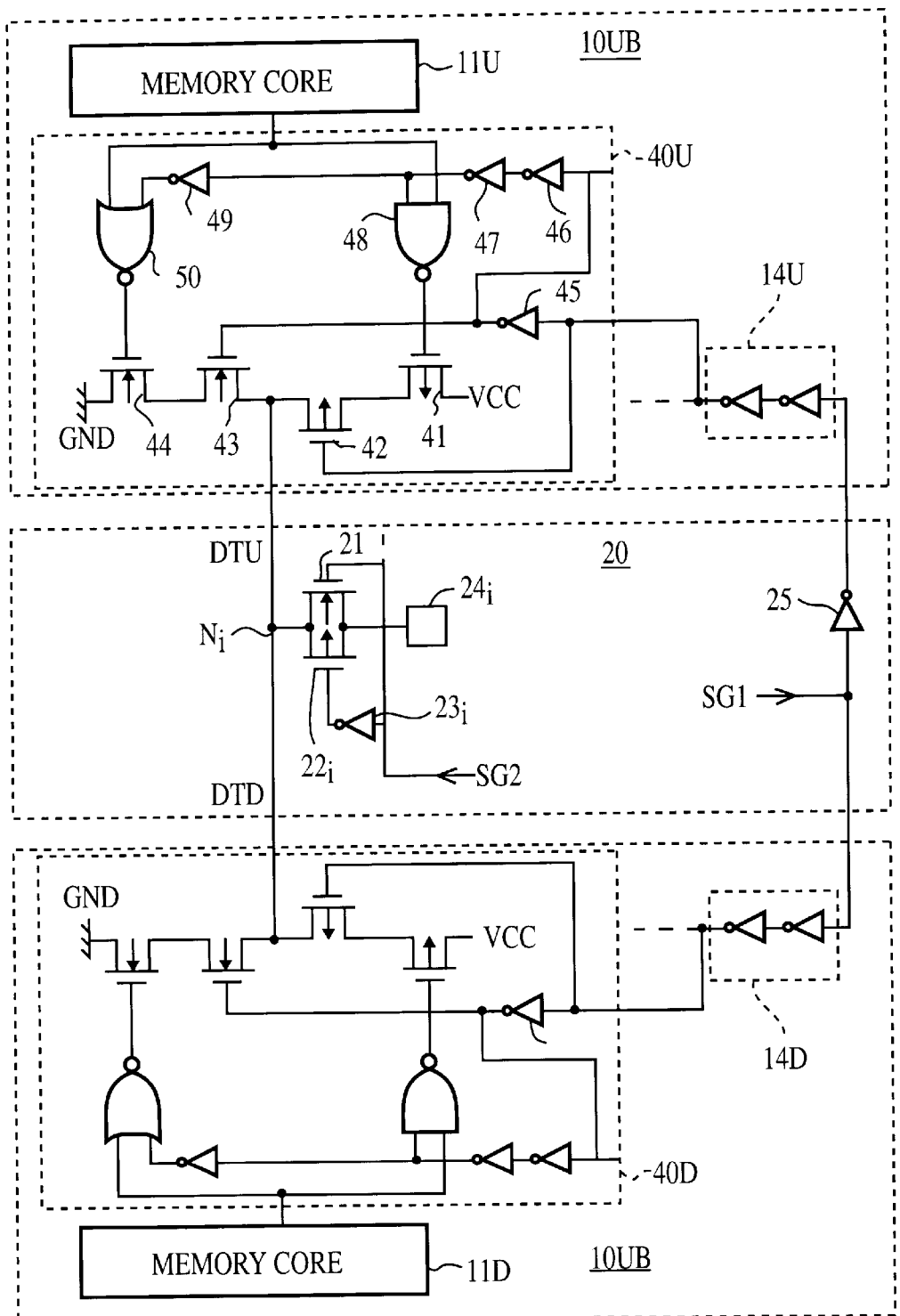
FIG. 3 is a circuit diagram showing a second embodiment of the present invention.

FIG. 3 is a circuit diagram of a semiconductor memory device of a second embodiment in accordance with the present invention. Common reference numerals will be assigned to the common elements to those shown in FIG. 1 illustrating the first embodiment.

In the semiconductor memory device of the second embodiment, memory blocks 10UB and 10DB are provided with first output control circuits 40Ui and 40Di (where i=1 through n) in place of the tristate buffers 13Ui and 13Di and the inverters 15Ui and 15Di in the memory blocks 10UA and 10DA of FIG. 1. In FIG. 3, only one each of the control circuits 40Ui and 40Di is shown. It is obvious, however, that there are control circuits having the same circuit configuration. Further, the memory blocks 10UB and 10DB are respectively provided with buffer amplifiers 14U and 14D in place of the output control circuits 30U and 30D.

The output control circuits 40Ui and 40Di have the same circuit configuration, hence, the circuit and operation of only one of them will be described and the description of the other will be omitted.

The output control unit 40Ui has PMOSs 41 and 42 and NMOSs 43 and 44 connected in series to constitute the output circuit. The source of the PMOS 41 is connected to a potential source VCC, while the source of the NMOS 44 is connected the ground GND. Connected to the drain of the PMOS 41 is the source of the PMOS 42. Applied to the gate of the PMOS 42 is a read signal SG1U generated from the buffer amplifier 14U in response to a read control signal SG1 generated from a read control signal generating circuit 1. Connected to the drain of the NMOS 44 is the source of the NMOS 43. Applied via an inverter 45 to the gate of the NMOS 43 is the signal produced by inverting the read signal SG1U. The drain of the NMOS 43 and the source of the PMOS 42 are connected.

The PMOS 42 and the NMOS 43 cut the signal from the memory cores 11U and 11D. Therefore, the PMOS 42 and the NMOS 43 works as an enabling circuit.

Connected to the output of the inverter 45 are inverters 46 and 47 which are connected in series to make up a delay circuit 51. Connected to the output of the delay circuit 51, i.e. the output of the inverter 47, are a first input of a NOT circuit 48 Z of logical AND (hereinafter referred to as "NAND circuit") and the input of an inverter 49. Connected to the output of the inverter 49 is a first input of a NOR circuit 50. The data output of a memory core 11U is connected to the second inputs of the NAND circuit 48 and the NOR circuit 50, respectively.

The output of the NAND circuit 48 is connected to the gate of the PMOS 41 and the output of the NOR circuit 50 is connected to the gate of the NMOS 44. An internal output line 13Ui is connected to the junction of the drain of the PMOS 42 and the source of the NMOS 43.

The internal output line 13Ui is connected to a node Ni (where i=1 through n) of a read control unit 20. Connected to the node Ni are one terminal of the NMOS 21i and one terminal of the PMOS 22i, the NMOS and PMOS being connected in parallel. Applied to the gate of the NMOS 21i is a read signal SG2 issued from a read signal generating circuit 2, and applied to the gate of the PMOS 22i via an inverter 23i is the inverted signal of the read signal SG2. The other terminal of the NMOS 21i and the other terminal of the PMOS 22i are connected to an output logic circuit 24i. Thus, the data output from the memory block 10UB to the node Ni is read in response to the read signal SG2.

The operation will now be described.

When the read signal SG1U of the memory block 10UB is switched to the active level L, the PMOS 42 and the NMOS 43 are immediately switched to the ON state. On the other hand, the signal applied to the first input of the NAND circuit 48 is supplied through the delay circuit 51, so that it is switched to level H after a predetermined time of delay. Likewise, the signal applied to the first input of the NOR circuit 50 is switched to level L after a predetermined time of delay. Hence, the output signal of the NAND circuit 48 is maintained at level H and the output signal of the NOR circuit 50 is maintained at level L until the predetermined time elapses after the read signal SG1U is activated. Thus, during this predetermined period of time, the PMOS 41 and the NMOS 44 are placed in the OFF state and the internal output line 13Ui is accordingly placed in the high impedance state.

After the time of delay set by the delay circuit 51 elapses, the signal applied to the first input of the NAND circuit 48 is switched to level H, while the signal applied to the first input of the NOR circuit 50 is switched to level L. Thus, according to the data output from the memory core 11U, either the PMOS 41 or the NMOS 44 is placed in the ON state and data DTUi is output to the internal output line 13Ui.

When the read signal SG1U is switched to the inactive level H, the PMOS 42 and the NMOS 43 are immediately placed in the OFF state and the internal output line 13Ui is accordingly placed in the high impedance state.

The semiconductor memory device of the second embodiment described above has output control units 40U and 40D which read information from the memory cores 11U and 11D, respectively, with the predetermined time of delay when the signals SG1U and SG1D are switched from the inactive state to the active state, and which immediately stop the reading of the information from the memory cores 11U and 11D when the signals are switched from the active state to the inactive state. Thus, the output of data from both memory blocks 10UB and 10DB is suspended for the predetermined time immediately after the switching of the read control signal SG1, making it possible to prevent pass current.

Furthermore, each of the internal output lines 13Ui and 13Di has the delay circuit 51, hence, it is possible to provide an optimum delay time for each of the internal output lines 13Ui and 13Di although the number of the circuit elements is increased. In addition, the delay circuits provided individually for the internal output lines permit shorter access time and further reliable access to the memory blocks. The present invention is not limited to the embodiments described above, instead, various modifications can be formed without departing from the spirit and scope of the invention. Some of the modifications are shown in (i) through (iv) below.

(i) The description has been given about the semiconductor memory device has two memory blocks 10DA and 10UA, etc. The present invention, however, can be applied also to a semiconductor memory device which has three or more memory blocks.

(ii) The inverters have been employed as the delay circuits. However, any other circuits may be used as long as they provide a predetermined time of delay.

(iii) The output control units 30U and 30D shown in FIG. 1 are not limited to the circuit configurations. The same advantages can be obtained by using any other circuit configurations as long as they are able to issue signals in the active state with a predetermined time of delay when the read signals SG1U and SG1D are activated, while immediately issue the signals in the inactive state when the read signals SG1U and SG1D are inactivated.

(iv) The circuit configurations of the output control units 40U and 40D shown in FIG. 3 are not limited thereto. The same advantages can be obtained by using any other circuit configurations as long as they are able to output data with a predetermined time of delay when the read signals SG1U and SG1D are activated, while immediately stop the output of the data when the read signals SG1U and SG1D are inactivated.

What is claimed is:

1. A semiconductor memory device comprising:

a first memory core and a second memory core respectively having a plurality of memory cells;

a plurality of first output circuits connected to said first memory core, said first output circuits outputting the data stored in said first memory core in response to a first control signal;

a plurality of second output circuits connected to said second memory core, said second output circuits outputting the data stored in said second memory core in response to a second control signal;

a plurality of internal output lines connected to said first output circuits and said second output circuits, respectively;

a first control signal generating circuit connected to said first output circuits for generating said first control signal to said first output circuits, said first control signal generating circuit receiving a first read signal having the active state and the inactive state thereof being switched in response to a read control signal, said first control signal generating circuit switching said first control signal to the active state with a predetermined time delay when said first read signal is switched from the inactive state to the active state, while it immediately switches said first control signal to the inactive state when said first read signal is switched from the active state to the inactive state; and a second control signal generating circuit which is connected to said second output circuits for generating said second control signal to said second output circuits, said second control signal generating circuit receiving a second read signal switched to the active state when said first read signal is switched to the inactive state, said second control signal generating circuit switching said second control signal to the active state with a predetermined time delay when said second read signal is switched from the inactive state to the active state, while it immediately switches said second control signal to the inactive state when said second read signal is switched from the active state to the inactive state.

2. A semiconductor memory device according to claim 1, further comprising a plurality of common output circuits connected to said internal output lines, respectively.

3. A semiconductor memory device according to claim 1, wherein said first output circuits are tristate buffers each having a control terminal coupled to receive the first control signal, an input terminal connected to said first memory core, and an output terminal connected to one of said internal output lines.

4. A semiconductor memory device according to claim 1, wherein said second output circuits are tristate buffers each having a control terminal coupled to receive the second control signal, an input terminal connected to said second memory core, and an output terminal connected to one of said internal output lines.

5. A semiconductor memory device according to claim 1, wherein the first and second control signal generating circuits include a delay circuit and a logic circuit, respectively.

6. A semiconductor memory device according to claim 5, wherein the logic circuit is a NOR circuit.

7. A semiconductor memory device comprising:

a first memory core and a second memory core respectively having a plurality of memory cells;

a plurality of first output circuits connected to said first memory core, said first output circuits outputting the data stored in said first memory core in response to a first control signal, each of said first output circuits comprising, an enabling circuit for enabling said first output circuit in response to the first control signal having an active state, and a gate circuit for allowing a passage of the data stored in said first memory core in response to a first delayed signal having an active state, the first delayed signal switching from an inactive state to the active state with a predetermined time delay when the first control signal is switched from an inactive state to the active state;

a plurality of second output circuits connected to said second memory core, said second output circuits outputting the data stored in said second memory core in response to a second control signal, each of said second output circuits comprising, an enabling circuit for enabling said first output circuit in response to the second control signal having an active state, and a gate circuit for allowing a passage of the data stored in said first memory core in response to a second delayed signal having an active state, the second delayed signal switching from an inactive state to the active state with a predetermined time delay when the first control signal is switched from an inactive state to the active state; and a plurality of internal output lines connected to said first output circuits and said second output circuits, respectively, for receiving data from said first and second output circuits.

8. A semiconductor memory device according to claim 7, wherein the second control signal is an inverted signal of the first control signal.

9. A semiconductor memory device according to claim 7, further comprising a plurality of common output circuits connected to said internal output lines, respectively.

10. A semiconductor memory device according to claim 7, wherein the enabling circuit includes a transistor having a first terminal coupled for receiving data from the first or the second memory core, a second terminal connected to one of the internal output lines and a control terminal coupled to receive the first or the second control signal.

11. A semiconductor memory device according to claim 7, wherein the gate circuit includes a logic gate having a first input terminal coupled to receive the first or the second delayed signal, a second input terminal connected to the first or the second memory core and an output terminal.

12. A semiconductor memory device according to claim 11, wherein the logic gate is an NAND circuit.

13. A semiconductor memory device according to claim 11, wherein the logic gate is an NOR circuit.

14. A method of reading out data from first and second memory cores to a common output node, the method comprising the steps of:

generating first and second read signals having inverted relationship each other; the first and second read signal having an active state and an inactive state;

generating a first read control signal based on the first read signal, the first read control signal switched from the active state to the inactive state when the first read signal is switched from the active state to the inactive state, the first read control signal switched from the inactive state to the active state after a predetermined time delay when the first read signal is switched from the inactive state to the active state;

generating a second read control signal based on the second read signal, the second read control signal switched from the active state to the inactive state when the second read signal is switched from the active state to the inactive state, the second read control signal switched from the inactive state to the active state after a predetermined time delay when the second read signal is switched from the inactive state to the active state;

reading data from the first memory core in response to the first read control signal; and reading data from the second memory core in response to the second read control signal.

15. A method of reading out data according to claim 14, wherein the step of generating the first read control signal includes the steps of:

generating a first delay signal base on the first read signal, the first delay signal having the predetermined time delay; and performing a logical NOR function of the first read signal and the first delay signal to obtain the first read control signal.

16. A method of reading out data according to claim 14, wherein the step of generating the second read control signal includes the steps of:

generating a second delay signal base on the second read signal, the second delay signal having the predetermined time delay; and performing a logical NOR function of the second read signal and the second delay signal to obtain the second read control signal.

17. A method of reading out data according to claim 14, further comprising the step of reading out data from the common output node to the outside in response to the third read control signal.

18. A method of reading out data according to claim 17, wherein the third read control signal has a shorter period of time of the active state than that of the first read control signal.

* * * * *